United States Patent [19]

Chen et al.

[11] 4,369,246

[45] Jan. 18, 1983

[54] PROCESS OF PRODUCING AN ELASTOMERIC PRINTING RELIEF

[75] Inventors: Gwendyline Y. Y. T. Chen, Wilmington; James F. Brennan, Newark, both of Del.

[73] Assignee: E. I. Du Pont de Nemours and Company, Wilmington, Del.

[21] Appl. No.: 229,068

[22] Filed: Jan. 28, 1981

Related U.S. Application Data

[60] Continuation-in-part of Ser. No. 160,439, Jun. 17, 1980, abandoned, which is a division of Ser. No. 926,579, Jul. 20, 1978, abandoned, which is a continuation-in-part of Ser. No. 374,567, Jun. 28, 1973, abandoned, which is a continuation-in-part of Ser. No. 130,470, Apr. 1, 1971, abandoned.

[51] Int. Cl.$^3$ .............................................. G03C 5/00
[52] U.S. Cl. ................................... 430/306; 430/271; 430/273; 430/281; 430/300; 430/302; 204/159.14
[58] Field of Search ............... 430/260, 262, 263, 271, 430/273, 281, 288, 300, 302, 306, 905; 204/159.14

[56] References Cited

U.S. PATENT DOCUMENTS

| 3,024,180 | 3/1962 | McGraw | 96/115 |
| 3,060,026 | 10/1962 | Heiart | 96/28 |
| 3,144,331 | 8/1964 | Thommes | 96/27 |
| 3,241,973 | 3/1966 | Thommes | 96/115 |
| 3,265,765 | 8/1966 | Holden et al. | 260/876 |
| 3,469,982 | 9/1969 | Celeste | 96/35.1 |
| 3,526,504 | 9/1970 | Celeste | 96/35.1 |
| 3,606,922 | 9/1971 | Doggett | 156/329 |
| 3,649,495 | 3/1972 | Rust | 204/159.24 |
| 3,674,486 | 7/1972 | Milgrom | 96/115 |

OTHER PUBLICATIONS

Tim Burkholder, "The 1974 HR 100 Winners", Industrial Research (Oct. 1974), pp. 23, 26, 27.

*Primary Examiner*—Jack P. Brammer

[57] ABSTRACT

Photosensitive elements comprising a layer of a solvent-soluble, thermoplastic, elastomeric, block copolymer, a nongaseous ethylenically unsaturated compound, and an addition polymerization initiator activatable by actinic light interposed between a support and cover sheet, a flexible polymeric film, e.g., polyamide, being interposed between the cover sheet and the surface of the layer. The elements are useful in preparing printing plates, particularly flexographic printing plates, and other relief images.

13 Claims, No Drawings

PROCESS OF PRODUCING AN ELASTOMERIC PRINTING RELIEF

CROSS REFERENCE TO RELATED APPLICATIONS

This application is a continuation-in-part of application Ser. No. 160,439, filed June 17, 1980 now abandoned, which is a division of application Ser. No. 926,579, filed July 20, 1978, now abandoned, which is a continuation-in-part of application Ser. No. 374,567, filed June 28, 1973, now abandoned, which is continuation-in-part of application Ser. No. 130,470, filed Apr. 1, 1971, now abandoned.

BACKGROUND OF THE INVENTION

This invention relates to photosensitive elastomeric elements having a layer of photosensitive, solvent-soluble, thermoplastic, elastomeric compositions which upon exposure to actinic light form solvent-insoluble, elastomeric materials, and to a process for making reliefs from such elements, and still more particularly, to a process for making flexographic printing reliefs from such elements.

Flexographic printing reliefs which are useful for letterpress printing of packaging materials, e.g., cardboard, plastic films, etc., are conventionally prepared by a laborious procedure involving art work, photographic negative, photoengraving, formation of a phenolic matrix, and hot press molding of a rubber plate. Printing reliefs with resilient surfaces can be prepared directly from photosensitive compositions as exemplified in assignee's patents, McGraw U.S. Pat. No. 3,024,180, granted Mar. 6, 1962 and Barney U.S. Pat. No. 2,948,611, granted Aug. 9, 1960. In the processes described in said patents, printing reliefs having characters of uniform printing height are produced by exposing to actinic light through an image-bearing transparency (negative or positive) a layer comprising an addition-polymerizable, ethylenically unsaturated compound or mixture of compounds, a solvent-soluble elastomeric binder, and having dispersed therethrough an addition-polymerization initiator activatable by said actinic light, and being supported on and adherent to a suitable support, e.g., a metal plate or foil, until addition polymerization, i.e., insolubilization of the composition occurs in the nonexposed areas. Removal of the layer in the nonexposed areas, e.g., by treatment with a suitable solvent in which the polymerized composition in the exposed areas is insoluble, leaves a printing relief of the line or halftone image of the transparency suitable for letterpress work. Frequently, however, these printing reliefs are not as elastomeric as the molded rubber plates. Also the photosensitive elements tend to cold flow due to high monomer concentrations needed and do not have the desirable features of vulcanized rubber without reducing solvent solubility as well. Furthermore, such compositions and elements often must be solvent coated, thus reducing the effective use of the elements.

SUMMARY OF THE INVENTION

An object of this invention is to provide new photosensitive, solvent-soluble elements which are useful in making reliefs, and particularly flexographic printing reliefs, for letterpress printing. Another object of this invention is to provide such photosensitive elements which are thermoplastic and elastomeric and resistant to cold flow prior to imagewise exposure. A further object of this invention is to provide such elements which result in flexographic printing reliefs for use with alcoholic or aqueous links. A still further object of this invention is to provide such elements which result in relief images useful as resists or in planographic printing. Still other objects will be apparent from the following description of the invention.

The invention includes photosensitive elements which comprise a sheet support; a layer of a photosensitive, elastomeric composition coated on said support having a thickness of from about 0.0005 to about 0.250 inch, said composition comprising (1) at least 30% by weight of at least one solvent-soluble, thermoplastic, elastomeric block copolymer containing at least two thermoplastic, nonelastomeric polymer blocks having a glass transition temperature above 25° C. and an average molecular weight of 2000–100,000, and between said thermoplastic, nonelastomeric polymer blocks an elastomeric polymer block having a glass transition temperature below 10° C. and an average molecular weight of about 25,000 to 1,000,000.

(2) at least 1% by weight of an addition-polymerizable ethylenically unsaturated compound containing at least one terminal ethylenical group, and (3) a polymerization-effective amount of polymerization initiator activatable by actinic radiation;

a flexible cover sheet; and a flexible, polymeric film interposed between said cover sheet and the surface of said layer.

Polymeric molecular weights referred to herein are number average molecular weights ($\overline{M}n$). The number average molecular weights for the block copolymers, e.g., as specified in the examples, can be determined by membrane osmometry utilizing a gel cellophane 600 W membrane manufactured by Arro Laboratories, Inc., Joliet, Ill., toluene as the solvent at 29° C. The $\overline{M}n$ for the nonelastomeric polymer blocks and elastomeric polymer blocks are preferably determined as follows:

A. The molecular weight of the first block (polystyrene) can be measured by gel permeation chromatography (GPC) of a terminated sample removed immediately after the polymerization. The chromatograph is calibrated using commercially available polystyrene molecular weight standards.

B. The $\overline{M}n$ of the second block (polyisoprene or polybutadiene) can be determined in the following manner:

(1) measuring by suitably calibrated GPC the $\overline{M}n$ of a sample of polystyrene-polyisoprene (or polybutadiene) diblock polymer terminated and removed immediately after its polymerization, and (2) subtracting from this value the Mn of the first block as determined in (A) above.

C. The $\overline{M}n$ of the third block (polystyrene) can be determined in the same general manner:

(1) measuring by suitably calibrated GPC the $\overline{M}n$ of the sample of polystyrene-polyisoprene (or polybutadiene)-polystyrene triblock polymer, and (2) subtracting from this value the $\overline{M}n$ of the diblock polymer obtained in (B) above. The block copolymers are manufactured by Shell Chemical Company and sold under the trademark "Kraton®".

In another aspect of this invention there is provided a process for forming a solvent-insoluble, elastomeric printing relief comprising applying to a sheet support a layer of the photosensitive, elastomeric composition as described above to a dry thickness of from about 0.0005 to about 0.250 inch; laminating a flexible, polymeric film and a flexible cover sheet to said layer, so that the surface of said film is contiguous to the surface of said layer; stripping said cover sheet from said film; imagewise exposing the photosensitive layer to actinic radiation through said film; and removing said film and the unexposed areas of said layer by solvent-washing.

The photosensitive elements of this invention have the advantage that the elastomeric compositions used to form the photosensitive layers possess certain mechanical properties similar to those of conventional reinforced rubber vulcanizates, such as high tensile strength and rapid return from high extension, as well as certain properties of conventional thermoplastics, such as a reversible transition to a melt with a moderate increase in temperature. Such novel features allow the easy preparation and manipulation of the photosensitive compositions into useful elements without affecting solubility in processing solvents. Furthermore, when elements of this invention are imagewise exposed to actinic radiation, the exposed areas become insoluble and result in tough, shaped, elastomeric reliefs with subsequent solvent removal of unexposed portions of the composition. The presence of a flexible, polymeric film interposed between the cover sheet and surface of the photosensitive layer, after removal of the cover sheet, provides a hard layer that is easily developed when the exposed areas of the element are developed. Due to their smooth hardness a surface, e.g., image-bearing negatives, placed in contact with the element is readily removed without sticking to the surface of the element.

This invention provides photosensitive elements for producing flexographic letterpress printing plates of uniform printing height from relatively inexpensive materials and with a marked reduction in labor requirements over the conventional procedure. Both the relief and printed images obtained show fidelity to the original transparency both in small details and in overall dimensions even when the element is imagewise exposed on a cylindrical support. The printing reliefs have the advantage that they have mechanical properties similar to conventional reinforced rubber vulcanizates and do not become permanently deformed in normal use. The reliefs have high impact strength and are not brittle but are tough and abrasion-resistant and have unusually long press wear using conventional alcohol and water based inks. Hardness of the reliefs can be easily changed by varying component concentrations.

DESCRIPTION OF THE PREFERRED EMBODIMENTS

In a preferred aspect of this invention the photosensitive compositions comprise a solvent-soluble, thermoplastic, elastomeric, A-B-A block copolymer, at least one compatible, addition-polymerizable, ethylenically unsaturated compound containing at least one terminal ethylenic group, and polymerization-effective amounts, e.g., 0.01 to 10%, or more, by weight of the photosensitive composition, of an addition-polymerization initiator activatable by actinic radiation and inactive thermally below 85° C., a polymerization effective amount being an amount that is sufficient to effect polymerization. Particularly preferred addition-polymerization initiators useful in the photosensitive compositions, are inactive thermally below 185° C. The photosensitive composition can also contain a small amount of a thermal addition-polymerization inhibitor and can also contain compatible fillers, plasticizers, antioxidants and antiozonants.

In general the ratio by weight of the block copolymer to the compatible, addition-polymerizable, ethylenically unsaturated compound would range from 99:1 to 1:1.

Preferred block copolymers useful in this invention have at least one unit of the general formula, A-B-A, wherein each A is an independently selected nonelastomeric polymer block having an average molecular weight of 2000–100,000 and a glass transition temperature above 25° C. and B is an elastomeric polymer block having an average molecular weight between about 25,000 and 1,000,000 and a glass transition temperature below about 10° C. The nonelastomeric blocks, A, having between them an elastomeric block, B, together comprise the unit A-B-A which represents the copolymers uniquely suitable for use in combination with the photopolymerizable components in the compositions of the invention. This unit may comprise the entire general formula of the copolymer; it may be appended to another polymer chain; or it may be repeating. It is, of course, possible to vary the precise nature of the unit within the scope of the invention, e.g., by using two different nonelastomeric terminal blocks, A, or by creating block or graft polymeric substitutions in blocks A and B. Preferably, the elastomeric mid-section blocks, B, are polymers of aliphatic conjugated diolefins while the nonelastomeric blocks, A, are those formed by polymerizing alkenyl aromatic hydrocarbons, preferably vinyl substituted aromatic hydrocarbons, and still more preferably vinyl monocyclic aromatic hydrocarbons. The block copolymers are disclosed in Holden et al. U.S. Pat. No. 3,265,765 and counterpart British Pat. No. 1,000,090, hereby incorporated by reference. Particularly preferred species of the subject copolymers comprise block copolymers of polystyrene terminal groups connected by a mid-section of polyisoprene or polybutadiene, e.g., polystyrene-polyisoprene-polystyrene or polystyrene-polybutadiene-polystyrene, the polydiene block being 70 to 90% by weight of the block copolymer. Other typical block copolymers useful in this invention are polystyrene-polybutadiene-polystyrene and polystyrene-polyisoprene-polystyrene block copolymers which have been hydrogenated according to the teachings of Jones, U.S. Pat. No. 3,431,323 and Hefele et al., U.S. Pat. No. 3,333,024. The hydrogenated block copolymers have the additional advantage of improved thermal and oxidative resistance. However, some residual unsaturation in hydrogenated block copolymers is desirable, since only very small concentrations of monomer are then needed in the photosensitive compositions to reduce solvent solubility upon exposure to actinic radiation. Still other typical block-copolymers useful in this invention are those wherein the terminal blocks are polyalkyl styrenes, e.g., poly(α-methyl styrene)-polyisoprene-poly (α-methyl styrene), and those composed of a plurality of polymer blocks, e.g., polyisoprene-polystyrene-polybutadiene-polystyrene-polyisoprene.

Among useful addition-polymerization ethylenically unsaturated compounds which form compatible mixtures with the aforesaid thermoplastic, elastomeric block copolymers are:

t-butyl arylate

N,N-diethylaminoethyl acrylate
1,4-butanediol diacrylate
hexamethylene glycol diacrylate
decamethylene glycol diacrylate
2,2-dimethylolpropane diacrylate
tripropylene glycol diacrylate
trimethylol propane triacrylate
2,2-di(p-hydroxyphenyl)-propane diacrylate
2,2-di(p-hydroxyphenyl)-propane dimethacrylate
polyoxyethyl-2,2-di(p-hydroxyphenyl)-propane dimethacrylate
polyoxypropyltrimethylol propane triacrylate (462)
butylene glycol dimethacrylate
hexamethylene glycol dimethacrylate
2,2,4-trimethyl-1,3-pentanediol dimethacrylate
1-phenyl ethylene-1,2-dimethacrylate
trimethylol propane trimethacryate
diallyl fumarate
styrene
1,4-diisopropenyl benzene
1,3,5-triisopropenyl benzene Compounds having one or two ethylenic groups are particularly preferred.

The photosensitive compositions of this invention essentially do not scatter the actinic radiation when in the form of thin layers, e.g., about 0.0005 to about 0.250 inch. In order to secure an essentially transparent mixture, i.e., a nonlight-scattering mixture, the thermoplastic-elastomeric block copolymer component should be compatible with and preferably soluble in, the ethylenic component when used within the aforementioned ratio range of 99:1 to about 1:1 wherein the ratio is the eight of block copolymer used to the weight of addition-polymerizable, ethylenically unsaturated compound used.

By compatibility is meant the ability of two or more constituents to remain dispersed with one another without causing appreciable scattering of actinic radiation. Compatibility is often limited by the relative proportions of the constituents and incompatibility is evidenced by formation of haze in the photosensitive composition. Some slight haze of layers coated or extruded from such compositions before or during exposure can be tolerated in the preparation of printing reliefs therefrom but when fine detail is desired, haze is preferably avoided. The amount of monomer, or any other constituent, used is therefore limited to those compatible concentrations below that which produces undesired light scatter or haze. The above compatible ethylenically unsaturated compounds form high-molecular weight addition polymers readily by photoinitiated addition polymerization in the presence of an addition polymerization initiator. Of course, the initiator absorbs sufficient radiant energy to initiate polymerization or cross-linking.

Practically any initiator of addition polymerization which is capable of initiating polymerization under the influence of actinic radiation can be used in the photosensitive compositions of this invention. Because transparencies transmit heat originating from conventional sources of actinic radiation and since the photosensitive compositions may be usually prepared under conditions resulting in elevated temperatures, the preferred initiators are inactive thermally below 85° C. They should be dispersible in the composition to the extent necessary for initiating the desired polymerization or cross-linking under the influence of the amount of radiation absorbed in relatively short term exposures. These initiators are useful in amounts from 0.001 to 10.0%, or more, and preferably from 0.01% to 5% based on the weight of the photosensitive composition.

Suitable photopolymerization initiators include vicinal diketones, e.g., diacetyl, benzil, α-pyridil, etc.; acyloins, e.g., benzoin, pivaloin, α-pyridoin; acyloin ethers, e.g., benzoin methyl and ethyl ethers; alpha-hydrocarbon-substituted aromatic acyloins, e.g., α-methyl benzoin, α-t-butyl benzoin, acyloin esters, e.g., benzoin acetate, and α-allyl benzoin; substituted and unsubstituted quinones having two intracyclic carbonyl groups attached to intracyclic carbon atoms in a conjugated six member carbocyclic ring there being at least one aromatic carbocyclic ring fused to the ring containing the carbonyl groups, e.g., ethyl-anthraquinone, benzanthraquinone, etc., and benzophenone and 4,4'-bis(dimethylamino)benzophenone. Initiators can be used separately or in conjunction with other coinitiators, e.g., ethylanthraquinone with 4,4'-bis(dimethylamino)benzophenone and benzoin methyl ether with triphenyl phosphine. Also useful in aspects of this invention are initiators and initiator systems disclosed in assignee's U.S. Pat. Nos. Chambers 3,479,185, issued Nov. 18, 1969; Chang et al., 3,549,367, issued Dec. 22, 1970; Fan, 3,558,322, issued Jan. 26, 1971 and Chang, 3,661,588, issued May 9, 1972.

The photosensitive compositions may also contain a small amount of thermal addition polymerization inhibitor, e.g., 0.001% to 2.0% based on the weight of the photosensitive composition. Suitable inhibitors that can be used in addition to the preferred 2,6-di-tert-butyl-4-methylphenol and p-methoxyphenol include hydroquinone, and alkyl and aryl-substituted hydroquinones, tert-butyl-pyrocatechol, pyrogallol, naphthylamines, beta-napthol, 2,6-di-tert-butyl-p-cresol, phenothiazone, pyridine, nitrobenzene and dinitrobenzene. Other useful inhibitors include p-toluquinone, chloranil and thiazine dyes, e.g., Thionine Blue G (CI 52025), Methylene Blue B (CI 52015) and Toluidine Blue (CI 52040). Such compositions can be photopolymerized or photocrosslinked without removal of the inhibitor.

The photosensitive elements of this invention can be made by solvent casting or by extruding, calendering or pressing at an elevated temperature of the photosensitive composition into the form of a layer on a suitable casting wheel, belt or platen as a self supporting sheet. The layer or sheet may be laminated to the surface of a suitable permanent support or, if necessary, it may be affixed by means of a suitable adhesive, or the solution may be coated directly onto a suitable support. The photosensitive elements may have antihalation material beneath the photosensitive layer. For instance, the support may contain an antihalation material or have a layer or stratum of such material on its surface. The elements may be made in the various manners described in Plambeck U.S. Pat. Nos. 2,760,863 and 2,791,504 and McGraw U.S. Pat. No. 3,024,180. The photosensitive layer itself can serve as the light absorption layer, e.g., when dyes or pigments are included in the photosensitive composition or when the layer is sufficiently thick.

Suitable base or support materials include metals, e.g., steel and aluminum plates, sheets and foils, and films or plates composed of various film-forming synthetic resins or high polymers, such as the addition polymers and in particular vinylidene chloride copolymers with vinyl chloride, vinyl acetate, styrene, isobutylene and acrylonitrile; vinyl chloride homopolymers and copolymers with vinyl acetate, styrene, isobutylene and acrylonitrile; linear condensation polymers such as polyesters, e.g., polyethylene terephthalate, polyamide, e.g., polyhexamethylenesebacamide; polyimides, e.g., films as disclosed in assignee's Edwards, U.S. Pat. No. 3,179,634 and polyester amide, e.g., polyhexamethyleneadipamide adipate. Fillers or reinforcing agents can be present in the synthetic resin or polymer bases such as the various fibers (synthetic, modified, or natural), e.g., cellulosic fibers, for instance, cotton, cellulose acetate, viscose rayon, paper; glass wool; nylon and polyethylene terephthalate. These reinforced bases may be used in laminated form. Various anchor layers disclosed in U.S. Pat. No. 2,760,863 can be used to give strong adherence between the support and the photosensitive layer or, in the case of transparent support, pre-exposure through the support to actinic radiation may be useful. The adhesive compositions disclosed in assignee's Burg U.S. Pat. No. 3,036,913 are also effective.

Printing reliefs can be made in accordance with this invention by exposing to actinic radiation selected portions of a photosensitive layer of an element described above, for example, through an image-bearing transparency or stencil having areas essentially transparent to actinic radiation and of substantially uniform optical density and areas opaque to actinic radiation and of substantially uniform optical density until substantial addition-polymerization or photocrosslinking takes place, i.e., the radiation-exposed portions of the layer are converted to the insoluble state with no significant polymerization or crosslinking taking place in the unexposed portions or areas of the layer, and removing unexposed portions of the layer by means of a solvent for the thermoplastic-elastomeric block copolymer. During the addition-polymerization or crosslinking, insolubilization occurs and the thermoplastic-elastomeric block copolymer/ethylenically unsaturated compound containing composition is converted to the insoluble state.

The thickness of the photosensitive layer is a direct function of the thickness desired in the relief image and this will depend on the subject being reproduced and the ultimate use of the relief, e.g., thick soft reliefs are useful for flexographic printing and thin hard reliefs are useful for planographic printing. In general, the thickness of the polymerizable layer will vary from about 0.0005 to about 0.250 inches or more and layers within this range of thickness will be used for the majority of the printing plates.

The photosensitive layers may also, if desired, include compatible plasticizers, other unsaturated compounds and polymers. Such agents, preferably superior solvents for the thermoplastic-elastomeric polymer, may be used to improve the rate or extent of insolubilization throughout the photosensitive layer, to facilitate the removal of the unexposed areas, and to aid the manufacture of the layers. Useful materials are hydrocarbon oils, e.g., naphthenic and paraffinic oils; polymers and resins, e.g., polystyrene, α-methyl styrene-vinyl toluene copolymers, pentaerythritol ester of hydrogenated rosin, polyterpene resins, ester reins, polyethylene, poly-α-methyl styrene, and polyarylates; and stearic acid.

The photosensitive layers can also contain immiscible polymeric or nonpolymeric organic or inorganic fillers or reinforcing agents which do not scatter actinic radiation and preferably are substantially transparent, e.g., polystyrene, the organophilic silicas, bentonites, silica, powdered glass, zinc stearate, zinc oxide, etc. having a particle size less than 0.0001 inch and in amounts varying with the desired properties of the photosensitive layer. Compositions may also contain dyes (e.g., indigo) for identification or aesthetic purposes, provided they do not strongly absorb actinic radiation and do not interfere with the addition polymerization reaction.

Resistance of photosensitive elements of this invention and printing reliefs made therefrom to oxygen and ozone attack can be improved by incorporating in the photosensitive composition a suitable amount of compatible well known antioxidants and/or antiozonants. Antioxidants useful in this invention include: alkylated phenols, e.g., 2,6-di-tert-butyl-4-methyl phenol; alkylated bis-phenols, e.g., 2,2-methylene-bis-(4-methyl-6-tert-butyl phenyl); 1,3,5-trimethyl-2,4,6-tris(3,5-di-tert-butyl-4-hydroxybenzyl) benzene; 2-(4-hydroxy-3,5-tert-butyl anilino)-4,6-bis-(n-octylithio)1,3,5-triazone; polymerized trimethyl dihydroquinone; zinc dibutyl dithiocarbamate and dilaurylthiodipropionate. Antiozonants useful in this invention include: micro crystalline wax and paraffin wax; dibutyl thiourea; 1,1,3,3-tetramethyl-2-thiourea; Antiozonant AFD, a product of Nafton Co.; norbornenes, e.g., di-5-norbornene-2-methyl adipate, di-5-norbornene-2-methyl maleate, di-5-norbornene-2-methyl terephthalate, etc.; Ozone Protector 80, a product of Reichhold Chemical Co.; N-phenyl-2-napthylamine; unsaturated vegetable oils, e.g., rapeseed oil, linseed oil, safflower oil, etc.; polymers and resins, e.g., ethylene vinyl acetate copolymer resin, chlorinated polyethylene, chlorosulfonated polyethylene, chlorinated ethylene methacrylic acid copolymer, polyurethanes, polypentadienes, polybutadiene, furfural derived resins, ethylene propylene diene rubber, diethylene glycol ester of resin, and α-methyl styrene-vinyl toluene copolymer. Ozone resistance of the printing relief produced can also be improved by annealing it at elevated temperatures prior to use.

The photosensitive compositions are, in general, solids. They are also, frequently, depending on their composition, somewhat tacky on the surface. This latter property is of advantage in that compositions adhere of themselves to a support being used and do not usually require the application of an adhesive to retain them on the support, both during photo-exposure and development steps and during subsequent use of the insolubilized material as a printing plate. A transparent cover sheet such as a thin film of polystyrene, polyethylene, polypropylene or other strippable material is used to prevent contamination of or damage to the photosensitive layer during storage or manipulation. A thin hard, flexible, solvent-soluble layer, e.g., a layer of a polyamide, copolymer of ethylene and vinyl acetate, etc., is used on the upper surface of the photosensitive layer to protect for reuse an image-bearing negative or transparency superposed thereon or to improve contact or alignment with the photosensitive surface. If desired, the photosensitive element can also have on the reverse surface of the support a pressure-sensitive adhesive layer provided with a protective strippable layer. Upon removal of the latter the element can be processed onto or otherwise adhered to a permanent support, e.g., a printing block or metal plate.

The photosensitive compositions of this invention can be prepared in many ways by admixing the three essential constituents specified above., i.e., (A) the compatible solvent-soluble thermoplastic-elastomeric block copolymer compounds described above, (B) the addition-polymerizable, ethylenically unsaturated compound containing at least one terminal vinylidene group, and, uniformly dispersed throughout, (C) an addition-polymerization initiator activatable by actinic radiation. For example, flowable or extrudable compositions can be made by mixing them and other desired adjuvants in any order and, if desired, with the aid of a solvent, e.g., chlorinated hydrocarbons, e.g., chloroform, carbon tetrachloride, trichloroethylene and chlorotoluene; ketones, e.g., methyl ethyl ketone, diethyl ketone and methyl isobutyl ketone; aromatic hydrocarbons, e.g., benzene, toluene and xylene; and tetrahydrofuran. The above solvents can contain as diluents small amounts of acetone, lower molecular weight alcohols, e.g., methyl, ethyl, propyl; aliphatic hydrocarbons such as petroleum ether and solvent naphtha; and esters, e.g., methyl, ethyl and butyl acetate. The solvent can be removed later by heating the admixture or extruded layer.

Conventional milling, mixing, and solution techniques can be used in making the compositions, the particular technique varying with the differences in properties of the respective components. The homogeneous, essentially nonlight scattering compositions are formed into sheets in any desired matter. For example, solvent-casting, hot pressing, calendering, or extrusion are suitable methods for preparing layers of the desired thickness.

Actinic radiation from any source and of any type can be used in these initiated processes. The radiation may emanate from point sources or be in the form of parallel rays or divergent beams. By using a broad radiation source, relatively close to the image-bearing transparency, the radiation passing through the clear areas of the transparency enters as divergent beams and thus irradiates a continually diverging area in the photopolymerizable layer underneath the clear portions of the transparency, resulting in a polymeric relief having its greatest width at the bottom of the photopolymerized layer, i.e., a frustum, the top surface of the relief being the dimensions of the clear area. Inasmuch as the free-radical-generating addition-polymerization initiators activatable by actinic radiation generally exhibit their maximum sensitivity in the ultraviolet range, the radiation source should furnish an effective amount of this radiation. Such sources include carbon arcs, mercury-vapor lamps, fluorescent lamps with special ultraviolet-light-emitting phosphors, argon glow lamps, and photographic flood lamps. Of these, the mercury-vapor lamps, particularly the sunlamp or "black light" type, and the fluorescent sunlamps, are most suitable.

When highly reflective supports are used, oblique rays passing through clear areas in the image-bearing transparency will strike the surface of the base at an angle other than 90° and after reflection will cause polymerization in the nonimage areas. This disadvantage can be overcome when the photosensitive layer is on a radiation-reflective support by an intervening stratum sufficiently absorptive of actinic radition so that less than 35% of the incident radiation is reflected. The layer absorptive of reflected radiation or nonradiation scattering layer, or antihalation layer, can be made by dispersing a finely-divided dye or pigment which substantially absorbs actinic radiation in a solution or aqueous dispersion of a resin or polymer which is adherent to both the support and the photoinsolubilized image and coating it on the support to form an anchor layer which is dried. Suitable antihalation pigments include carbon black, manganese dioxide, dyes, e.g., Acid Blue Black (CI 20470) and Acid Magenta O (CI 42685). A dyed metal plate is also useful.

The antihalation layer intermediate between the photosensitive layer and the reinforcing support when used must have adequate adhesion to the reinforcing support and the photosensitive layer and not react with the radiation-absorptive material. Suitable polymeric or resin carriers for the radiation-absorptive dyes or pigments which can be used include polyvinyl compounds, e.g., polyvinyl chloride homopolymers, and copolymers, e.g., vinyl chloride with vinyl acetate, diethyl fumarate or ethyl acrylate. Copolymers of acrylic and methacrylic acid may also be used.

The solvent liquid used for washing or "developing" the plates made from the photosensitive compositions of this invention should have good solvent action on the solvent-soluble thermoplastic elastomeric block copolymer/ethylenic composition and little action on the insolubilized image or upon the support material, antihalation layer, or anchor layer in the period required to remove the nonpolymerized or noncrosslinked portions. Methyl ethyl ketone, benzene, toluene, xylene, carbon tetrachloride, trichloroethane, trichloroethylene, methylchloroform, tetrachloroethylene, etc. are particularly useful solvents. Best results are sometimes obtained when the solvent is warm, e.g., 30°–50° C. or when the solvent is used in a mixture with a nonsolvent, e.g., trichloroethylene with ethanol. Incorporation of such nonsolvents reduces swelling of the insolubilized image.

In the development step where the relief is formed, the solvent may be applied in any convenient manner, as by pouring, immersion, spraying, or roller application. Brushing aids in the removal of the unpolymerized or uncrosslinked portion of the composition.

The printing reliefs made in accordance with this invention can be used in all classes of printing but are most applicable to those classes of printing wherein a distinct difference of height between printing and nonprinting areas is required and particularly to the flexographic printing class wherein a resilient print area is required, e.g., for printing on deformable printing surface. These classes include those wherein the ink is carried by the raised portion of the relief such as in dry-offset printing, ordinary letterpress printing, the latter requiring greater height differences between printing and nonprinting areas, and those wherein the ink is carried by the recessed portions of the relief such as in Intaglio Printing, e.g., line and inverted halftone. The plates are also useful for multicolor printing.

The photosensitive elements of this invention are also useful in the preparation of photoresists for etching, plating, etc.; planographic and gravure plates, and screens for "silk screen" printing or as stencils. The elements, upon removal of the support can be attached to printing cylinders, e.g., plastic or metal cylinders.

The photosensitive elements are suitable for other purposes, in addition to the printing uses described above, in which readily insolubilized, solid, addition polymerizable elements are useful, e.g., as ornamental plaques or for producing ornamental effects; as patterns for automatic engraving machines, foundry molds, cutting and stamping dyes; for name stamps; for relief maps; in the preparation of printed circuits; and in the preparation of other plastic or elastomeric articles.

The invention will be further illustrated by but is not intended to be limited to the following examples wherein parts and percentages are by weight.

EXAMPLE I

A photosensitive, thermoplastic, elastomeric solid sheet was prepared by the following procedure: a solution of 0.0467 g 2-ethylanthraquinone and 0.0924 g p-methoxyphenol in a small amount of tetrahydrofuran was added to 4.33 g trimethylolpropane triacrylate. This mixture was added to a cyclohexane solution (140 ml) of 30.16 g polystyrene-polybutadiene-polystyrene block copolymer (MW ~76,000) and 0.06 g 2,6-di-tert-butyl-4-methylphenol and was then heated to 60° C. and stirred vigorously for two hours. (The polybutadiene block having a glass transition temperature about minus 85° C. comprises 69% by weight of the block copolymer which has a solution viscosity of 4000 cps (measured as a 25% by weight toluene solution with a Brookfield Viscometer Model LVF using a spindle number 3 at 6 rpm with scale factor of 200), a specific gravity of 0.95 and 800% elongation (obtained for films cast from 25% by weight toluene solution), the polystyrene blocks have glass transition temperatures of approximately 100° C.). The resulting homogeneous solution was degassed in an oven at 70° C. for several hours until a porous rubber foam remained. This solid was further degassed under vacuum at 60° C. overnight and then molded into a 0.030 inch thick clear layer between two sheets of 0.002 inch, uncoated, biaxially oriented, heat set, polyethylene terephthalate film in a platen press at 110° C. using 0.033 inch spacers by applying 16 psi pressure for several minutes. After stripping off the polyester cover sheet half the layer was exposed for 40 minutes to actinic radiation from a bank of four parallel 15 W General Electric Blacklight lamps (F15T8-BLB) (lamp center 1.5 inches apart) at a distance of 3 inches. When subsequently immersed in tetrahydrofuran overnight, the exposed half of the layer swelled slightly in contrast to the unexposed half which dissolved in tetrahydrofuran within a few minutes.

EXAMPLE II

A 0.064 inch thick photosensitive elastomeric sheet was prepared as in Example I with the use of suitable spacers on the platen press. After removing the polyester cover sheet the photosensitive sheet was conditioned under nitrogen gas for two days and was then imagewise exposed for 20 minutes through an image-bearing transparency to actinic radiation as described in Example I. The sheet was then washed in tetrahydrofuran for 2.25 minutes producing a deep relief image which was subsequently dried, conditioned with nitrogen gas and post-exposed to actinic radiation as described in Example I for 2.5 hours. The relief assembled a molded vulcanized rubber relief.

EXAMPLE III

A solution of 30.01 g of polystyrene-polybutadiene-polystyrene block copolymer of Example I, 4.02 g 1,4-butane-diol diacrylate, 0.0448 g 2-ethylanthraquinone, 0.06 g 2,6-di-tert-butyl-4-methylphenol and 0.087 g p-methoxyphenol in 40 ml cyclohexane was prepared as in Example I and then solvent was removed by heating the solution to 70° under vacuum. After drying the same at 60° C. under vacuum overnight it was molded between two sheets of 0.002 inch, biaxially oriented, heat set, polyethylene terephthalate film at 110° C. and 16 psi for 15 minutes in a platen press using suitable spacers to give a 0.064 inch thick sheet. After removing the polyester cover sheet the sample was conditioned to nitrogen gas 4 hours, imagewise exposed for 16 minutes through an image-bearing transparency to actinic radiation as in Example II and subsequently washed in tetrahydrofuran for 1 minute. The resulting elastomeric deep relief plate was further conditioned in nitrogen gas for two days and then post-exposed to actinic radiation as in Example II. When the surface of this elastomeric relief inked with an alcohol based ink was pressed to a paper sheet a printed image resulted which faithfully reproduced a negative of the original image transparency.

EXAMPLE IV

A photosensitive, thermoplastic, elastomeric solid sheet was prepared from 156.3 g polystyrene-polyisoprene-polystyrene block copolymer (MW ~100,000), 23.4 g trimethylolpropane trimethacrylate, 0.216 g 2-ethylanthraquinone, 0.12 g p-methoxyphenol, and 0.313 g 2,6-di-tert-butyl-4-methylphenol using procedures as in Example III. (The polyisoprene block has a glass transition temperature about minus 72° C. and comprises 85% by weight of the block copolymer which has a solution viscosity of 1600 (measured as in Example I); a specific gravity of 0.93; a hardness of 37 as determined with a Shore ® Type A durometer (a product of the Shore Instrument & Mfg. Co., Inc.), and hereinafter expressed as "Shore ® A hardness of"; and 1300% elongation (for film cast from 25% by weight toluene solution).) One of the polyester cover films was stripped off and the sample conditioned for one day in nitrogen gas. It was imagewise exposed for 25 minutes through an image-bearing transparency placed in contact with the photosensitive surface using the radiation source described in Example I. The exposed surface was spray washed with methyl chloroform for 4.5 minutes. The sheet with the relief was then post-exposed through the polyester base for 50 minutes to the same radiation source producing a highly resilient relief firmly adhered to the polyester support.

EXAMPLE V

A photosensitive, thermoplastic, elastomeric sheet was prepared by dissolving 3.5 g benzoin methyl ether in 35 g hexamethylene glycol diacrylate. The solution was added to 659.9 g polystyrene-polyisoprene-polystyrene block copolymer (described in Example IV) and 1.6 g 2,6-di-tert-butyl-4-methylphenol in a 1 gallon bottle and the components were mixed by manual shaking. Five batches of the mixture were fed continuously into a 20×1 inch single screw extruder (Killion, model #100). The mix was extruded at 170° C. and 42 rpm for about 5 minutes (~3.0 kg per hour) and came out through a 4×0.030 inch sheeting die and was quenched on a water chilled casting wheel to form 4×0.040 inch sheet. About 80 g of this sheet was hot pressed between two 8×8 inch sheets of 0.002 inch, uncoated, biaxially oriented and heat set polyethylene terephthalate film into a 0.110 inch plate with a Pasadena Hydraulic Inc. press at 100° C. and 20,000 lb. pressure using two 0.110 inch spacers. The top polyester sheet was subsequently removed and the plate was laminated with a 0.00075 inch polyethylene film using a rubber squeegee. The plate's polyethylene side was covered with an image-bearing transparency and placed in a vacuum frame. The plate was then imagewise exposed for 5 minutes under vacuum with a bank of four parallel 40 watt ultraviolet fluorescent lamps (Sylvania, FR48T12-BL-VHO-180 Blacklite) in conventional lamp holder at a 4 inch distance. Lamp centers were 2 inches apart and two cooling fans were used to reduce heat build up. After exposure, the polyethylene sheet was removed and the surface of the elastomeric plate was washed with a plush brush wet with 3:1 methylchloroform and ethanol solvent mixture producing a relief image on the plate. The plate was dipped in a 2% solution of 2,6-di-tert-butyl-4-methylphenol in 3:1 methylchloroform and ethanol solvent mixture. The wet plate was post-exposed in air for 10 minutes using the same radiation source described above. The plate had a Shore ® A hardness of 45. The polyester backing sheet was stripped off and the plate was mounted on a 15 inch circumference solid cylinder with double sided adhesive tape. The cylinder was mounted in a Kidder GI press (36 inch wide) fitted with a 200 line per inch Anilox roll. "Polyprint Beckerman Red" #40-0-3478 ink, a product of Del Val, Inc. was used. Stock was 0.00125 inch extruded polyethylene and was supplied in rolls of 13 inch diameter and each roll yielded approximately 3000 impressions. The flexographic plate made a press run of 195,000 impressions and showed no sign of wear. The print quality from this plate is at least equivalent to that from a plate made conventionally from natural rubber.

EXAMPLE VI

A photosensitive, thermoplastic, elastomeric solid sheet was prepared from 1.1 g poly-α-methylstyrene-polybutadiene-poly-α-methylstyrene block copolymer (MW ~115,000, 25% poly-α-methylstyrene having a glass transition temperature of 175° C.), 0.23 g hexamethylene glycol diacrylate, 0.16 g naphthenic oil, 0.015 g 2,6-di-tert-butyl-4-methylphenol, 0.0011 g benzoin methyl ether using procedures as in Example III. One of the polyester cover sheets was removed and the photosensitive sheet was laminated with a 0.00075 inch polyethylene film. The sample was exposed through an image-bearing transparency (placed on the polyethylene cover sheet) in a vacuum frame for 25 minutes to actinic radiation (described in Example I). The polyethylene film was stripped off and the exposed elastomeric sheet was developed by brushing in methylchloroform for 4 minutes. The sample was then post-exposed to the same radiation source for 30 minutes. The resulting elastomeric sheet had a 0.027 inch relief image and resembled mold vulcanized rubber relief. When cemented to a wood block the relief could be used with an ink pad as a rubber stamp.

EXAMPLE VII

A photosensitive, thermoplastic, elastomeric sheet was prepared, imagewise exposed and processed as in Example VI except that 1.1 g poly-α-methylstyrene-polyisoprene-poly-α-methylstyrene (MW ~82,000, 30% poly-α-methylstyrene) was used instead of poly-α-methylstyrene-polybutadiene-poly-α-methylstyrene. The elastomeric relief produced was 0.030 inch and could be used as a rubber stamp to print on paper or other stock.

EXAMPLE VIII

Fourteen thermoplastic elastomeric sheets were prepared from polystyrene-polyisoprene-polystyrene block copolymer (described in Example IV and designated SIS); the antioxidant, 2,6-di-tert-butyl-4-methylphenol, described AO; either one of the two polymerization initiators activatable by actinic radiation, 2-ethyl anthraquinone, designated PI-1, and benzoin methyl ether, designated PI-2; and one of the ethylenically unsaturated compounds listed in the following table and in the amount designated:

| Sheet | Grams Used | Ethylenically Unsaturated Compound |
|---|---|---|
| 1 | 36.7 | hexamethylene glycol dimethacrylate |
| 2 | 36.7 | 2,2,4-trimethyl-1,3-pentanediol dimethacrylate |
| 3 | 11.8 | decamethylene glycol diacrylate |
| 4 | 36.7 | diallyl fumarate |
| 5 | 36.7 | 1,3,5-triisopropenyl benzene |
| 6 | 3.5 | 2,2-di(p-hydroxyphenyl)-propane dimethacrylate |
| 7 | 5.6 | polyoxyethyl-2,2-di(p-hydroxyphenyl) propane dimethacrylate |
| 8 | 5.0 | t-butyl acrylate |
| 9 | 5.0 | N,N-diethylaminoethyl acrylate |
| 10 | 3.8 | butylene glycol dimethacrylate |
| 11 | 15.0 | 1-phenylethylene-1,2-dimethacrylate |
| 12 | 15.0 | styrene |
| 13 | 15.0 | 1,4-diisopropenyl benzene |
| 14 | 10.0 | 2,2-di(p-hydroxyphenyl)-propane diacrylate |

The grams of the other components used in each sheet are tabulated in the following table:

| Sheet | SIS | AO | PI-1 | PI-2 |
|---|---|---|---|---|
| 1 | 199.5 | 0.5 | 0.6 | 0 |
| 2 | 199.5 | 0.5 | 0.6 | 0 |
| 3 | 223.4 | 0.6 | 0.59 | 0 |
| 4 | 199.5 | 0.5 | 0.6 | 0 |
| 5 | 199.5 | 0.5 | 0.6 | 0 |
| 6 | 29.92 | 0.08 | 0.06 | 0 |
| 7 | 49.27 | 0.13 | 0.14 | 0 |
| 8 | 44.89 | 0.11 | 0.09 | 0 |
| 9 | 44.89 | 0.11 | 0.09 | 0 |
| 10 | 59.75 | 0.25 | 0.12 | 0 |
| 11 | 84.79 | 0.21 | 0 | 0.5 |
| 12 | 84.79 | 0.21 | 0 | 0.5 |
| 13 | 84.79 | 0.21 | 0 | 0.5 |
| 14 | 188.15 | 0.5 | 0 | 0.8 |

Sheets 6 through 10 were prepared as in Example IV and the other sheets were prepared as in Example XVIII. As in Example IV each of the sheets was imagewise exposed for about 45 minutes to actinic radiation and then spray-washed for 4 minutes with a 7:3 solvent mixture of methyl ethyl ketone and methylchloroform. Each resulting elastomeric printing relief resembled conventional natural rubber flexographic printing plates in their durability and the quality of the printed stock.

EXAMPLE IX

Seven thermoplastic elastomeric sheets were prepared from polystyrene-polyisoprene-polystyrene block copolymer (described in Example IV and designated SIS); the antioxidant, 2,6-di-tert-butyl-4-methylphenol, designated AO; either one of the two ethylenically unsaturated compounds, hexamethyleneglycol diacrylate, designated HD, and trimethylolpropane trimethacrylate, designated TT; and one of the polymerization initiators listed in the following table. Also included in the table are the number of grams of each component used in the sheets.

| Sheet | Initiator | SIS | AO | HD | TT |
|---|---|---|---|---|---|
| 1 | 0.70 g benzophenone 0.01 g 4,4'-bis-(dimethyl-amino)-benzophenone | 50.01 | 0.13 | 9.5 | 0 |
| 2 | 0.5 g benzoin methyl ether 0.5 g trimethyl-phosphine | 93.17 | 0.23 | 5.0 | 0 |
| 3 | 0.5 g α-tert-butyl benzoin | 94.26 | 0.24 | 5.0 | 0 |
| 4 | 0.92 g 2-tert-butyl anthraquinone | 299.25 | 0.75 | 0 | 55.02 |
| 5 | 1.20 g benzoin | 105.14 | 0.26 | 6.0 | 0 |
| 6 | 0.5 g benzoin acetate | 94.26 | 0.24 | 5.0 | 0 |
| 7 | 0.8 g benzil | 112.92 | 0.28 | 6.0 | 0 |

The first sheet was prepared as in Example IV and the others as in Example XVIII. As in Example IV each of the seven sheets was imagewise exposed to actinic radiation, processed to produce a relief image. Each resulting elastomeric printing relief produced image quality comparable to that of conventionally molded natural rubber plates and for sheet "3" the print quality was superior to the others and required less exposure to insolubilize the exposed areas.

EXAMPLE X

A polystyrene-polybutadiene-polystyrene block copolymer (MW ~ 100,000, wherein the polybutadiene block, of which about 40% by weight is formed by 1,2 addition-polymerization and about 60% by 1,4 addition-polymerization, comprises 75% by weight of the block copolymer) was hydrogenated as taught in Jones U.S. Pat. No. 3,431,323. The polybutadiene block was more than 95% hydrogenated whereas the polystyrene blocks were less than 10% hydrogenated. 80 g Of the hydrogenated block copolymer, 8.0 g hexamethylene glycol diacrylate, 0.2 g 2-ethylanthraquinone, 0.8 g 2,6-di-tert-butyl-4-methylphenol, and 0.4 g p-methoxyphenol were roll-milled for 20 minutes at 155° C. and then pressed, into a plate at 140°-150° C. as in Example V, into a 0.110 inch thick sheet except that one of the cover sheets used was a 0.04 inch resin coated polyethylene terephthalate film described in Example IV of Alles, U.S. Pat. No. 2,779,684. The plate was imagewise exposed for 20 minutes as in Example V. The uncoated polyethylene terephthalate cover film was then stripped off and the plate was developed by spray washing with toluene for 1.5 minutes producing a relief image. The developed plate was dried and then post-exposed to actinic radiation described in Example V through the resin coated support for 30 minutes producing a supported elastomeric relief image useful for flexographic printing and with greater resistance to oxidative attack than conventionally prepared natural rubber printing plates.

EXAMPLE XI

A photosensitive, thermoplastic, elastomeric sheet was prepared as in Example X except that the block copolymer was essentially completely hydrogenated removing both the butadiene as well as the styrene unsaturation. A second photosensitive thermoplastic elastomeric sheet was similarly prepared with 110 g of the above hydrogenated block copolymer, 8 g trimethylolpropane trimethacrylate, 0.2 g 2-ethylanthraquinone, 1.1 g 2,6-di-tert-butyl-4-methylphenol, and 0.40 g p-methoxyphenol. An elastomeric relief plate firmly adhered to the coated polyethylene terephthalate support was produced from each of the two photosensitive sheets when imagewise exposed and processed as in Example X. Compared to conventionally prepared natural rubber plates, the above elastomeric printing plates could be used longer for flexographic printing before ozone and oxidative attack of the plates interfered with print quality.

EXAMPLE XII 80 g Of the partially hydrogenated block copolymer described in Example X, 12 g trimethylolpropane triacrylate, 0.8 g benzoin methyl ether, and 0.8 g 2,6-di-tert-butyl-4-methylphenol were roll-milled at 155° C. until homogeneously mixed. The mixture was then hot pressed into a 0.110 inch sheet between two 0.002 inch, uncoated, biaxially oriented, heat set polyethylene terephthalate film as in Example V. A second photosensitive, thermoplastic, elastomeric sheet was prepared as above except that 80 g of the fully hydrogenated block copolymer described in Example XI was substituted for the above partially hydrogenated block copolymer. After one of the polyester cover sheets was replaced with a polyethylene film each sample was imagewise exposed for 30 minutes as in Example V. The polyethylene film was stripped off and each sample was spray washed with toluene for 2 minutes producing an elastomeric relief which upon drying and subsequent post-exposure to the same radiation as above for 10 minutes was used as a printing plate for printing on polyethylene stock. The resistance of both printing plates to ozone attack was substantially better than similar printing plates produced conventionally from natural rubber.

EXAMPLE XIII

Photosensitive, thermoplastic, elastomeric sheet was prepared by the following procedure: 2166 g polystyrene-polyisoprene-polystyrene block copolymer (described in Example IV), 180 g hexamethylene glycol diacryate, 22.5 g benzoin methyl ether, 5.4 g 2,6-di-tert-butyl-4-methylphenol, 240 g napthenic oil, 360 g α-methylstyrene-vinyltoluene copolymer (melt viscosity at 160° C. is about 10 poises), and 30 g microcrystalline wax were mixed as in Example V and the mixture fed through a melt extruder. The material was extruded at about 115° C. through a 6 inch wide die. The extrudate was quenched in cold water for about 10 minutes. It was subsequently pre-heated to 85° C. and then calendered at about 110° C. between two polyester sheets in an Adamson United four roll laboratory calender to give an elastomeric photosensitive layer 0.11 inch thick. One of the polyester sheets was 0.002 inch, uncoated, biaxially oriented, heat set polyethylene terephthalate; the other sheet was 0.004 inch, biaxially oriented, heat relaxed, polyethylene terephthalate coated with a thin resin coating as in Example X. The 0.002 inch polyester cover sheet was replaced with a 0.005 inch thick polypropylene film and the sample was exposed for 20 minutes as in Example V through a transparency bearing the negative image of a gasket. With the polypropylene cover film removed, the sample's elastomeric surface was washed with a brush wet with a 3:1 mixture of trichloroethylene and alcohol. The sample was then dried, post-exposed to the same actinic radiation as above for 10 minutes and the remaining polyester support stripped away. The resulting elastomeric gasket was 0.105 inch thick with a Shore ® A hardness of 45. It closely resembled a positive of the original transparency and could be compressed or stretched without permanent deformation. A second complicated gasket was similarly produced from a transparency bearing the negative image of an irregular honeycomb.

EXAMPLE XIV

A photosensitive element useful in preparing deep relief letterpress printing plates was prepared as follows:

A primed support, using tin-plated steel 16 inches wide and 0.0063 inch thick was prepared as described in Example III of German Pat. No. 1,959,716 issued May 3, 1967.

An adhesive composition was composed of (A) 100 grams of a solution of 18% solids in a mixed solvent consisting of dioxane, toluene and cyclohexanone (30/46/2), the solids consisting of a copolyester prepared from a reaction mixture of an excess of ethylene glycol and dimethyl terephthalate, dimethyl isophthalate, dimethyl sebacate and dimethyl adipate in a molar ratio of the latter four reactants of 4:4:1:1 respectively, (B) 3.33 grams of the polyisocyanate solution described in Example I of German Pat. No. 1,959,716, and (C) 11.25 grams of a solution of 20% solids in a mixed solvent consisting of methyl ethyl ketone and dioxane (1/1), the solids consisting of the epoxy resin described in Example I of German Pat. No. 1,959,716.

This adhesive composition was coated on the primed, tin-plated steel support forming an adhesive composition layer about 0.0015 inch thick. The adhesive composition was dried and cured by heating for 1 minute at 230° C. resulting in an adhesive layer about 0.0003 inch thick.

A barrier solution was composed of (A) 100 grams of a solution of 20% solids in a mixed solvent consisting of methyl ethyl ketone and methyl Cellosolve ® (7/3), the solids consisting of a photopolymerizable composition prepared in a manner similar to that disclosed in Example I of Smith U.S. Pat. No. 3,012,952 and (B) 1.60 grams of benzoyl peroxide (thermal initiator).

The barrier composition was coated on the adhesive coated support forming a barrier composition layer about 0.005 inch thick. The barrier composition was dried and cured by heating for 1 minute at 230° C., resulting in a partly polymerized barrier layer about 0.001 inch thick.

A photosensitive thermoplastic elastomeric layer was prepared as in Example III from the following components: 61.69 g polystyrene-polybutadiene-polystyrene block copolymer (Example I), 16.0 g 1,4-butanediol diacrylate, 0.20 g 2-ethylanthraquinone, 0.25 g p-methoxyphenol and 0.15 g 2,6-di-tert-butyl-4-methyl-phenol. This layer was laminated to the coated, tin-plated steel support described above by heat pressing at 230° C. between the support and an uncoated polyester cover sheet for 25 minutes using 0.03 inch spacers. After the polyester cover sheet was removed the photosensitive sheet was imagewise exposed as in Example II for 25 minutes and then was spray washed with tetrahydrofuran for 4–5 minutes. The resulting relief was 0.028 inch deep and, after post-exposure, as in Example II had a Shore ® D hardness of 43. The relief image was resilient, elastic and free from brittleness and the letterpress printing plate could be bent through an angle of 180° without the relief cracking. The plate was placed on a printing cylinder 4 inches in diameter, inked and used for printing. Satisfactory printed reproductions of the negative of the image transparency were obtained.

EXAMPLE XV

A photosensitive, thermoplastic elastomeric sample was prepared from the following components using the procedures in Example III: 50 g polystyrene-polyisoprene-polystyrene block copolymer (described in Example IV), 2.8 g polyoxypropyl trimethylolpropane triacrylate (MW 462), and 0.21 g benzoin methyl ether. The sample was pressed into a 0.040 inch sheet as in Example III except that one polyester cover sheet was replaced with an uncoated 0.002 inch polyimide film prepared as in Example 19 of U.S. Pat. No. 3,179,634. The polyester cover sheet was removed and the sample was imagewise exposed as in Example IV for 15 minutes in a reduced pressure of nitrogen gas. The sheet was then spray-washed 3.5 minutes with a 7:3 solvent mixture of ethylacetate and methylchloroform. The elastomeric relief when used as in Example III faithfully reproduced a negative of the original image transparency.

EXAMPLE XVI

Five samples each weighing 120 g were prepared, exposed and processed as in Example XVII, except that each contained 5% by weight hexamethyleneglycol diarylate, 0.5% by weight benzoin methyl ether, 0.2% by weight 2,6-di-tert-butyl-4-methylphenol and one of the following components:

| Sheet | % by Weight | Component |
|---|---|---|
| 1 | 0.3 | 1,3,5-trimethyl-2,4,6-tri(3,5-di-tert-butyl-4-hydroxybenzyl)benzene |
| 2 | 0.3 | 2-(4-hydroxy-3,5-tert-butylaniline)-4,6-bis(n-octylthio-1,3,5-triazine) |
| 3 | 1.5 | 1,1,3,3-tetramethyl-2-thiourea |
| 4 | 10.0 | linseed oil |
| 5 | 15.0 | α-methylstyrene vinyl toluene copolymer (melt viscosity 140° C. 35 poise) |

When compared to the photosensitive sheet in Example XVII, Sheets 1 and 2 were less sensitive to the presence of oxygen. Similarly printing reliefs prepared from Sheets 3, 4 and 5 were less susceptible to defects caused by ozone attack, cracking with age and flexing.

EXAMPLE XVII

A photosensitive, thermoplastic elastomeric layer was prepared from 180.3 g polystyrene-polyisoprene-polystyrene block copolymer (described in Example IV), 10.0 g hexamethylene glycol diacrylate, 1.0 g benzoin methyl ether, 0.45 g 2,6-di-tert-butyl-4-methylphenol, 0.6 g 2,2-methylene-bis-(4-methyl-6-tert-butylphenol), 0.6 g dilaurylthiodipropionate, 5.0 g 3-cyclohexenylidene methylbenzyl ether, and 2 g microcrystalline wax. The ingredients were roll milled at 120° C. in a Thropp 6×12 rubber mill and then the mixture was pressed into sheet and subsequently imagewise exposed for 10 minutes as in Example V. The exposed surface was spray washed 4 minutes with a 7:3 ethylacetate:methylchloroform solvent mixture, was dried and then post-exposed 10 minutes. The elastomeric relief after six months storage had no indications of cracking due to ozone attack. Similarly a relief made the same way and elongated by 25% by looping had no apparent ozone damage after 6 days. Both reliefs when mounted on a press and inked produced satisfactory printed images.

EXAMPLE XVIII

A photosensitive, thermoplastic elastomeric layer between polyester cover sheets was prepared as in Example XVII using the following components: 232.42 g polystyrene-polyisoprene-polystyrene block copolymer (described in Example IV), 2.36 g hexamethylene glycol diacrylate, 0.59 g 2-ethylanthraquinone and 0.58 g 2,6-di-tert-butyl-4-methylphenol. After imagewise exposure as in Example III for 25 minutes the exposed surface was spray washed with a 3:2 solvent mixture of 2-butanone and methylchloroform. The sample was dried and post-exposed for 45 minutes to actinic radiation described in Example I producing an elastomeric relief 0.024 inch deep and with a Shore ® A hardness of 43. An elastomeric relief 0.250 inches thick was similarly prepared and when used as a flexographic printing plate using corrugated paper stock produced print quality at least comparable to that produced from a conventional rubber plate.

EXAMPLE XIX

A photosensitive layer was prepared using the following components: 30.04 g polystyrene-polybutadiene-polystyrene block copolymer (described in Example I), 100 ml cyclohexane, 7.46 g triethyleneglycol diacrylate, 0.0711 g 2-ethylanthraquinone, 0.0872 g p-methoxyphenol, and 0.06 g 2,6-di-tert-butyl-4-methylphenol. The block copolymer and 2,6-di-tert-butyl-4-methylphenol were refluxed in cyclohexane until a viscous solution formed after which the other components were added in cyclohexane solution. The mixture was heated and stirred until a clear solution was formed. The solution was then heated in vacuum at 70° C. to remove the solvent. The resulting material was pressed between two sheets of aluminum foil into a 0.030 inch elastomeric sheet as in Example I and similarly exposed. A transparent film resulted which was harder than the unexposed film and did not dissolve when immersed in tetrahydrofuran for 16 hours.

EXAMPLE XX

A solution of 22.79 g polystyrene-polyisoprene-polystyrene block copolymer (described in Example IV), 20.00 g 2,2-dimethylolpropane diacrylate, 0.50 g benzophenone, 0.15 g 4,4'-bis-(dimethylamino)benzophenone, 0.06 g 2,6-di-tert-butyl-4-methylphenol, 1.5 g napthenic oil and 5 g pentaerythritol ester of hydrogenated rosin in 100 ml methylchloroform was prepared and coated on a 0.004 inch film of polytetrafluoroethylene using a 0.006 inch doctor knife. After drying, the photosensitive layer was laminated to the copper surface of a copper clad epoxy fiber glass board by heat pressing at 105° C. The polytetrafluoroethylene cover sheet was stripped off and replaced with a 0.001 inch polypropylene film and imagewise exposed for 5 minutes as in Example V. The cover sheet was discarded and the exposed surface was brushed for 3.5 minutes with a 3:7 methylchloroform:ethylacetate solvent mixture and the plate was immersed in agitated ferric chloride solution at 40° C. Areas corresponding to the unexposed portions of the layer were etched away and the remaining exposed layer was removed with trichloroethylene forming a negative copper image of the original transparency.

EXAMPLE XXI

A photosensitive layer laminated to a copper-clad epoxy fiber glass board with a polypropylene cover sheet was prepared as in Example XX. The photosensitive layer was exposed through a transparency bearing the image of a printed circuit for 5 minutes using a nuArc Plate Maker of the flip-top type using a Xenon Arc source, Model No. FT-261 manufactured by the nuArc Co., Inc., Chicago, Ill. The unexposed portions of the layer were then removed as in Example XX forming a negative resist image of the printed circuit. The resist board was rinsed with water then dipped in 25% sulfuric acid for 20 seconds, followed by a water rinse, and then a rinse in 25% ammonium persulfate solution for 25 seconds. The board was rinsed once again in water and then dipped in 25% sulfuric acid for 20 seconds and finally rinsed with distilled water.

The resist copper board was placed in a copper pyrophosphate plating bath of the following composition.

| | |
|---|---|
| Copper (Cu$^{+2}$) | 30 g/l |
| Pyrophosphate (P$_2$O$_7^{-4}$) | 200 g/l |
| Nitrate (NO$_3^{-1}$) | 8 g/l |
| Ammonia (NH$_3$) | 2 g/l |
| Orthophosphate (HPO$_4^{-2}$) | 0.1 g/l |

This bath was held at pH 8.2, and 122° F. The weight ratio of pyrophosphate to copper was 7.5. The bath was operated at 1.5 volts with a cathode current density of 30 amperes/sq. ft. Copper was deposited in an electroplating bath for 15 minutes on the unprotected nonresist areas of the imaged copper-clad board after which it was removed from the bath and dried in air.

The electrolytically-deposited copper of the resist board was then plated over with gold and then the resist was stripped off using methylene chloride. The board was etched in 45° Baume ferric chloride and formed a pattern plated printed circuit board.

EXAMPLE XXII

A solution of 12.55 g polystyrene-polyisoprene-polystyrene block copolymer (described in Example IV), 9.0 g hexamethylene glycol diacrylate, 0.30 g bis-(2-o-chlorophenyl-4,5-diphenylimidazolyl), 0.15 g tris-(2-methyl-4-diethylaminophenyl)methane, 0.50 g naphthenic oil and 2.50 g pentaerythritol ester of hydrogenated rosin in 75 ml trichloroethylene was prepared and coated on a plate of nontreated, brush grained aluminum using a 0.002 inch doctor knife. After drying, the photosensitive surface was laminated with 0.001 inch polypropylene film using a squeegee and then imagewise exposed for 2 minutes as in Example V. The polypropylene film was stripped off and the exposed layer was brush-developed for 2.5 minutes as in Example XX. The aluminum plate with the developed image was gummed with gum arabic and the imaged surface was wetted with water and applied with standard oleophilic planographic ink. Areas corresponding to the unexposed regions of the plate did not retain ink whereas areas corresponding to the exposed regions of the plate did. The inked image when pressed to paper stock produced a negative printed image of the original transparency.

EXAMPLE XXIII

A 0.250 inch photosensitive thermoplastic elastomeric layer was prepared, exposed, and processed as in Example XVIII, except that prior to exposure both polyester cover sheets were removed. The photosensitive, self supporting elastomeric layer could be stretched and manipulated around a cylinder or other such objects. Upon imagewise exposure and solvent-washing, a 0.250 inch thick elastomeric layer with a 0.024 inch deep relief was obtained which, as in Example XVIII, produced print quality at least comparable to that produced from a conventional rubber plate.

EXAMPLE XXIV

A polyamide-coated polyester cover film was prepared by coating a solution of 5 g of an alcohol-soluble polyamide resin in 100 ml of 1:1 solvent mixture of methanol and chloroform on a 0.002 inch uncoated biaxially oriented, heat set, polyethylene terephthalate film using a 0.006 inch doctor knife. (The polyamide resin, Elvamide ® 8061, a product of E. I. du Pont de Nemours and Company, is colorless, transparent, has a melting point of 300°-320° F., a specific gravity of 1.08 at 73° F. and in a 10% methanol solution at 77° F. has a Brookfield viscosity of 30 cp). The coating dried to a 0.00015 inch thick smooth, hard, flexible film.

A 0.110 inch thick photosensitive, thermoplastic elastomeric sheet between polyester cover sheets was prepared as in Example XV except that one of the polyester cover sheets was coated with a polyamide film as described above which was laminated to the photosensitive surface. The resulting sample could be manipulated with no detrimental effect to the photosensitive layer. The polyester cover sheet was stripped from the polyamide surface which adhered to the photosensitive layer. The hard, flexible smooth polyamide surface was covered with an image-bearing transparency. The position of the transparency in close contact with the polyamide surface could be easily adjusted. The photosensitive layer was imagewise exposed through the polyamide film and transparency for 5 minutes as in Example V. The plate was brushed for 3 minutes with a 3:1 solvent mixture of trichloroethylene and methanol to produce a relief image and remove the polyamide film. When dry, the relief image was post-exposed as in Example V and when used as a printing relief produced print images which faithfully reproduced a negative of the image transparency.

EXAMPLE XXV

A photosensitive, thermoplastic, elastomeric layer containing 70.25 parts by weight of polystyrene-polyisoprene-polystyrene block copolymer, 5.0 parts hexamethylene glycol diacrylate, 0.75 part benzoin methyl ether, 15.0 parts α-methyl styrene vinyl toluene resin, 8.0 parts naphthenic mineral oil, 1.0 part synthetic ceresin wax, and about 0.12 part 2,6-di-tert-butyl-4-methylphenol and laminated on each side with a polyester sheet was prepared as in Example XIII except that the 0.002 inch heat set polyethylene terephthalate cover sheet was first coated with a solvent-soluble, hard, flexible film. The coated surface of the cover sheet was then laminated to the photosensitive layer during the calendering process as in Example XIII.

The coated cover sheet was prepared by coating a solution of 300 g polyethylene-polyvinyl acetate copolymer (Elvax ® 420, a product of E. I. du Pont de Nemours and Company; 18% vinyl acetate; melt index of 125–175 g/10 minute using the procedure ASTM D-1238), 27 g stearic acid in 2 liters trichloroethylene on 0.002 inch, uncoated, biaxially oriented, heat set, polyethylene terephthalate film using a 0.006 inch doctor knife and then drying at 180° F.

The photosensitive sample could be manipulated and could be stored for several months with no significant change in sensitivity. The 0.002 inch polyester cover sheet was stripped from the polyethylene-polyvinyl acetate copolymer coating which adhered to the surface of the photosensitive layer. The photosensitive sheet was then exposed for 5 minutes to actinic radiation through an image-bearing transparency on the copolymer-coated surface using a Dycril ® photopolymer printing plate rotary exposure unit, Model 3832 RCL, a product of E. I. du Pont de Nemours and Company. The hard, flexible copolymer-coated surface did not separate from the photosensitive layer when the sheet was flexed and manipulated and insured uniform close contact of the transparency to the sheet during exposure to actinic radiation.

The exposed sample was brushed for five minutes with 3:1 solvent mixture of trichloroethylene and ethanol to remove the copolymer coating and unexposed areas of the photosensitive elastomeric layer. The resulting supported relief plate was dried and post exposed as in Example V and when used as a flexographic printing plate gave print quality at least equivalent to that from conventionally made rubber plates.

EXAMPLE XXVI

A photosensitive element was prepared as in Example XXV and was then exposed through the 0.004 inch, heat relaxed polyethylene terephthalate support sheet to actinic radiation from a parallel bank of three Westinghouse FS 20 fluorescent sunlamps at a distance of 1.5 inches for 10 minutes. Then, as in Example XXV, the 0.002 inch, heat set polyethylene terephthalate cover sheet is stripped from the element, which was imagewise exposed for 4 minutes, and developed to produce a relief image suitable for flexographic printing.

The relief produced from the pre-exposed element was improved over the similar relief produced in Example XXV in that the depth of the developed relief was limited to 0.035 inch, the background areas did not show brush marks and solvent swelling during processing was reduced resulting in shortened drying time. Further advantages were that the dimensional stability of the photosensitive elements prior to imagewise exposure was improved, thus simplifying storage and handling. Also for similar reasons the need to post-expose after imagewise exposure is obviated.

All the elements illustrated in the examples of this invention can contain a flexible, polymeric film interposed between the cover sheet and the surface of the photosensitive layer. Thus, in accordance with the invention, one may prepare solvent-insoluble printing reliefs, and flexographic printing plates in particular, by applying a layer of the photosensitive, elastomeric composition of the invention to a sheet support (e.g., polyethylene terephthalate); laminating a flexible, polymeric film (e.g., polyamide or polyethylene-polyvinyl acetate copolymer) and a flexible cover sheet to said layer, so that the surface of the film is contiguous to the surface of the photosensitive layer; stripping the cover sheet from the film; imagewise exposing the photosensitive layer through the film; and removing said film and the unexposed areas of said layer by solvent washing. The photosensitive composition may be applied to the sheet support by coating techniques or by laminating or squeeging at a suitable temperature the composition between the sheet support and the film coated flexible cover sheet. Many variations of this preferred process will be apparent to those skilled in the art. For example, the cover sheet and the step of stripping it may be omitted where storage and handling prior to exposure are not required; the relief image may be post-exposed as in Examples V and XXIV or pre-exposed as in Example XXVI. Other variations may also be made within the scope of the claims.

The resin used in the following examples was a thermoplastic rubber-like polymer descrbed in U.S. Pat. No. 3,265,765. The material is a block copolymer of polystyrene and polybutadiene. In each formulation 10 grams of the resin material in the form of dry pellets was employed. The following photosensitizers and crosslinking agents were added in these formulations, each being given an example number.

satisfactory, due apparently to excessive light screening by the high content of the photosensitizer.

Of Examples XXXII–XXXV, Examples XXXII and XXXIII gave the best printing surfaces with raised indicia ranging between 0.010 and 0.013 inch high in Example XXXII, and between 0.016 to 0.025 inch in Example XXXIII. Example XXXIV had raised indicia of about 0.006 inch while Example XXXV, with a 10-fold increase in photosensitizer over Example XXXIV, had no perceptible indicia on the surface.

Generally, indicia heights between 0.015 and 0.040 inch are desirable for good letterpress printing. However, the conditions of printing and the number of impressions desired may determine this parameter.

EXAMPLE XXXVI

A photosensitive, thermoplastic composition is prepared as follows:

1.40 parts 2,2-dimethoxy-2-phenylacetophenone is dissolved in a mixture of 5.30 parts hexamethylene glycol diacrylate, 3.70 parts hexamethylene glycol dimethacrylate, 0.166 part 2,6-di-tertiary-butyl-para-cresol and

| Additive[1] | Example Number | | | | | | | | |
|---|---|---|---|---|---|---|---|---|---|
|  | XXVII | XXVIII | XXIX | XXX | XXXI | XXXII | XXXIII | XXXIV | XXXV |
| Photosensitizer: | | | | | | | | | |
| Benzoin |  | 0.02 | 0.02[1] |  | 0.10 | | | | |
| Phenanthrenequinone | | | | 0.2 | | | | | |
| Michler's ketone | | | | | | 0.0007 | 0.007 | 0.014 | 0.14 |
| Crosslinking agent: | | | | | | | | | |
| Triallyl cyannurate | 0.60 | 0.60 | | 0.60 | 0.60 | | | 0.60 | 0.60 |
| Pentaerythritol triacrylate | | | 0.60 | | | | | | |
| Polyvinyl cinnamate[2] | | | | | | 0.013 | 0.333 | | |

[1]Numbers are in grams/10 grams of resin.
[2]Serves as photosensitizer as well as crosslinking agent.

In making these formulations into photoresist sheets, the pellet material was thoroughly dry mixed with the additives and then the mixture was dissolved in about 50 cc of methylene chloride. Sufficient solvent should be used to completely dissolve the resin. The amount of solvent above this indicated minimum is not critical; however, it is preferred to use an amount approaching the minimum to reduce the quantity of solvent which must be subsequently removed and recovered. After the methylene chloride was removed by evaporation, the resulting composite material was comminuted into small pieces which were molded into sheets using a pressure of 25,000 psi and 225° F. For these examples, the sheet ranged in thickness between 0.039 and 0.045 inch.

Sheets of each of the nine formulations were contacted with a photographic negative serving as the process transparency and exposed to ultraviolet radiation from a 435-watt ultraviolet lamp (Hanovia Lamp Division, Engelhard Hanovia, Inc.) for from about 4 to 128 minutes. Subsequent to this exposure the sheets were adhered to a glass surface with cement and then the unexposed nonprinting background areas were washed out with xylene.

Of Examples XXVII–XXXI, Example XXVII containing no photosensitizer, did not develop any perceptible printing surface; while Examples XXVIII and XXIX, with the smaller amounts of benzoin as photosensitizer were observed to have raised printing surfaces of the order of 5 to 10 mils. Examples XXXI had a perceptible printing surface but Example XXX, which contained 2% by weight of the photosensitizer, was not 0.001 part hydroquinone. A solution of C.I. 109 Red Dye (0.003 part) in hydroxyethyl methacrylate (0.13 part) is added to the mixture. This solution is added to 82.30 parts polystyrene-polyisoprene-polystyrene block copolymer (Kraton ® 1107, Lot No. 06BBF, manufactured by Shell Chemical Co., Polymers Division, Houston, Tex.) in a twin screw extruder. A mixture of 6.0 parts α-methyl styrene/vinyl toluene resin (softening point 100° C., refractive index 1.583, viscosity at 25° C. for a 65% solution in toluene is 1.6–1.9 poises, manufactured by Hercules, Inc., Wilmington, Del.), and 1.0 part grated microcrystalline hydrocarbon wax (melting point 73°–76° C., flash point 113° C., manufactured by International Wax Refining Co., Valley Stream, N.Y.) is melted at about 100° C. and is metered into the photosensitive mixture in the extruder. The twin screw extruder performs the function of melting, mixing, deaerating and filtering the photosensitive composition.

The following coating solution is prepared:

| Ingredient | Amount (%) |
|---|---|
| Methylene chloride | 81.0 |
| Methanol | 2.0 |
| N—methyl pyrolidone | 10.0 |
| Polyamide resin, Lot No. 0B25005[1] | 7.0 |

[1]The polyamide resin, Macromelt ® 6900, a product of Henkel Adhesives Company, a division of Henkel Corporation, 4620 West 77th Street, Minneapolis, MN is essentially colorless, has a Ball and Ring Softening Point, of 266–302° F.; melt index at 347° F. of 5–15 g/10 minutes; flash point 570° F.; percent water absorption, 1 day is 0.2, 7 days is 0.5; tensile yield of 1,200 psi; tensile break of 3,500 psi; and elongation of 540%. The tensile yield, tensile break and elongation are determined at 24° C. according to ASTM Procedure D-1708).

The above polyamide resin coating solution is coated on 0.005 inch (0.127 mm) thick polyethylene terephthalate film using an extrusion die coater to provide a dry film thickness of 0.00017 inch (0.004 mm) on the film, and the dry coated film is wound on wide stock cores.

The photosensitive composition described above is extruded at 160° C. through a die. The extruded composition enters the rotating bank in a two-roll calender and is calendered between two films, one being a 0.005 inch (0.127 mm) flame-treated polyethylene terephthalate support film, and the second being the polyamide-coated polyethylene terephthalate film described above (flame-treated and polyamide sides adjacent to the extruded photosensitive layer). The calender nip can be adjusted to produce photosensitive layers over a wide range of thicknesses, e.g., 0.112 inch (~2.85 mm) thick.

The photosensitive element having a photosensitive layer thickness of 0.112 inch (~2.85 mm) is cooled with blown air and is passed under a bank of black light fluorescent tubes, such as Sylvania's BL lamps, placed transverse to the path of movement, continually exposing the element through its support to polymerize a predetermined thickness of the photosensitive layer adjacent the support. The element is cut to convenient lengths, e.g., 40 inches.

The photosensitive element is placed in an exposure unit, as described below, and is given an overall exposure in air through the support for a predetermined length of time (for example, a 0.112-inch (~2.85 mm) thick photosensitive layer requiring the polymerization of an 0.080 inch (2.03 mm) portion of the layer is exposed for about 3 minutes depending on lamp intensity).

The polyethylene terephthalate film on the surface of the polyamide layer is stripped therefrom. The polyamide layer remains adhered to the photosensitive layer. The hard, flexible smooth polyamide surface is covered with an image-bearing transparency, and the photosensitive layer is imagewise exposed for 5 minutes under vacuum in a Cyrel® 3040 Exposure Unit (registered trademark of E. I. du Pont de Nemours and Company) fitted with Sylvania BL-VHO fluorescent lamps.

After exposure the transparency is removed, and the exposed element is placed in a rotary drum-brush type Cyrel® 3040 Processor. The unpolymerized areas of the element are removed in the processor by washing with a mixture of 75 volume percent tetrachloroethylene/25 volume percent n-butanol. The developed element (printing plate) is placed in a forced hot air drier or other suitable drier and is dried at 60° C. until the plate attains its original thickness. The dry plate is then detackified for 1 to 3 minutes in a solution of aqueous acidic hypochlorite (900 parts water, 90 parts Clorox®, 10 parts conc. HCl). The wet plate is post-exposed in air for 10 minutes using the same exposure source used for the imagewise exposure described above. The plate has a Shore® A hardness in the range of 50–55.

The plate can now be mounted on a flexographic press cylinder with commercially available double sided adhesive tape and printed with standard flexographic inks. The print quality is equal to or better than that produced with rubber plates printed in the same manner.

What is claimed is:

1. A process for forming a solvent-insoluble, elastomeric printing relief comprising applying to a sheet support a layer of a photosensitive, elastomeric composition to a dry thickness of from about 0.005 to about 0.250 inch, said composition comprising
  (1) at least 30% by weight of at least one solvent-soluble, thermoplastic, elastomeric block copolymer containing at least two thermoplastic, nonelastomeric polymer blocks having a glass transition temperature above 25° C. and an average molecular weight of 2000–100,000, and between said thermoplastic, nonelastomeric polymer blocks an elastomeric polymer block having a glass transition temperature below 10° C. and an average molecular weight of about 25,000 to 1,000,000.
  (2) at least 1% by weight of an addition-polymerizable ethylenically unsaturated compound containing at least one terminal ethylenical group, and
  (3) a polymerization-effective amount of polymerization initiator activatable by actinic radiation;

laminating a flexible, polymeric film and a flexible cover sheet to said layer, so that the surface of said film is contiguous to the surfaces of said layer; stripping said cover sheet from said film; imagewise exposing the photosensitive layer to actinic radiation through said film; and removing said film and the unexposed areas of said layer by solvent-washing.

2. A process according to claim 1 wherein the photosensitive, elastomeric composition is applied to the sheet support by solvent casting.

3. A process according to claim 1 wherein the photosensitive, elastomeric composition is applied to the sheet support by extruding at an elevated temperature.

4. A process according to claim 1 wherein the photosensitive, elastomeric composition is applied to the sheet support by calendering.

5. A process according to claim 4 wherein the photosensitive, elastomeric composition is calendered between two sheets.

6. A process according to claim 1 wherein the thermoplastic, nonelastomeric polymer blocks are the terminal polymer blocks of the copolymer and are connected by the elastomeric polymer block.

7. A process according to claim 6 wherein the copolymer is polystyrene-polyisoprene-polystyrene.

8. A process according to claim 6 wherein the copolymer is polystyrene-polybutadiene-polystyrene.

9. A process according to claim 1 wherein the flexible, polymeric film is a polyamide.

10. A process according to claim 1 wherein the flexible, polymeric film is a copolymer of ethylene and vinyl acetate.

11. A process according to claim 9 or 10 wherein the cover sheet is polyethylene terephthalate.

12. A process according to claim 1 wherein the ethylenically unsaturated compound contains two terminal ethylenic groups.

13. A process for imaging and developing an elastomeric printing relief formed from a photosensitive, elastomeric element which comprises a sheet support; a layer of a photosensitive, elastomeric composition coated on said support having a thickness of from about 0.005 to about 0.250 inch, said composition comprising
  (1) at least 30% by weight of at least one solvent-soluble, thermoplastic, elastomeric block copolymer containing at least two thermoplastic, nonelastomeric polymer blocks having a glass transition temperature above 25° C. and an average molecular weight of 2000–100,000, and between said thermoplastic, nonelastomeric polymer blocks an elastomeric polymer block having a glass transition temperature below 10° C. and an average molecular weight of about 25,000 to 1,000,000.

(2) at least 1% by weight of an addition-polymerizable ethylenically unsaturated compound containing at least one terminal ethylenical group, and (3) a polymerization-effective amount of polymerization initiator activatable by actinic radiation;

a flexible cover sheet and a flexible, polymeric film interposed between said cover sheet and the surface of said layer, the process comprising stripping the cover sheet from the flexible, polymeric film, imagewise exposing the photosensitive layer to actinic radiation through the film, and removing the film and the unexposed areas of the photosensitive layer by solvent-washing.

* * * * *